(12) United States Patent
Jeong (10) Patent No.: US 10,943,666 B2
(45) Date of Patent: *Mar. 9, 2021

(54) POWER SWITCH CIRCUIT AND METHOD PROVIDING POWER SUPPLY TO MEMORY DEVICE

(71) Applicant: MagnaChip Semiconductor, Ltd., Cheongju-si (KR)

(72) Inventor: Duk Ju Jeong, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/520,426

(22) Filed: Jul. 24, 2019

(65) Prior Publication Data

US 2020/0051652 A1    Feb. 13, 2020

(30) Foreign Application Priority Data

Aug. 8, 2018 (KR) .................... 10-2018-0092470

(51) Int. Cl.
| | |
|---|---|
| *G11C 17/18* | (2006.01) |
| *G11C 17/16* | (2006.01) |
| *H01L 27/02* | (2006.01) |
| *H03K 3/356* | (2006.01) |
| *H02H 9/04* | (2006.01) |

(52) U.S. Cl.
CPC .............. *G11C 17/18* (2013.01); *G11C 17/16* (2013.01); *H01L 27/0281* (2013.01); *H02H 9/046* (2013.01); *H03K 3/356104* (2013.01)

(58) Field of Classification Search
CPC ...... G11C 17/18; G11C 17/16; H01L 27/0281; H03K 3/356104; H02H 9/046
See application file for complete search history.

(56) References Cited

U.S. PATENT DOCUMENTS

| | | | |
|---|---|---|---|
| 10,062,447 B2 | 8/2018 | Jeong | |
| 2008/0170433 A1* | 7/2008 | Yamada | G11C 16/08 365/185.03 |
| 2010/0220511 A1* | 9/2010 | Kurjanowicz | H01L 27/101 365/96 |
| 2014/0118869 A1* | 5/2014 | Meng | H02H 9/043 361/56 |
| 2018/0316185 A1* | 11/2018 | Lai | G11C 7/062 |

* cited by examiner

*Primary Examiner* — Tri M Hoang
(74) *Attorney, Agent, or Firm* — NSIP Law (57) ABSTRACT

A power switch circuit comprises a first level shifter configured to turn on a first switching element configured to receive a supply voltage from an external voltage supply pad in response to a program operation of a one-time programmable (OTP) memory cell array, a second level shifter configured to turn on a second switching element and provide the supply voltage to the OTP memory cell array in response to the program operation, a third level shifter configured to turn on a third switching element and provide an internally generated power voltage to the OTP memory cell array in response to a read operation of the OTP memory cell array, and an Electro-Static Discharge (ESD) protection circuit configured to turn off the first switching element in response to a flow of ESD voltage from the voltage supply pad.

24 Claims, 6 Drawing Sheets

POWER SWITCH CIRCUIT AND METHOD PROVIDING POWER SUPPLY TO MEMORY DEVICE

CROSS-REFERENCE TO RELATED APPLICATIONS

This application claims the benefit under 35 U.S.C. 119(a) of Korean Patent Application No. 10-2018-0092470 filed on Aug. 8, 2018 in the Korean Intellectual Property Office, the entire disclosure of which is incorporated herein by reference for all purposes.

BACKGROUND

1. Field

The following description relates to a power switch circuit and a method for providing a power supply to a one-time programmable (OTP) memory device. The following description also relates to a power supply switching circuit including an Electro Static Discharge (ESD) protection circuit that prevents the supply of ESD voltage.

2. Description of Related Art

Static electricity is an electrical phenomenon that occurs from electrostatic charges generated by direct contact or by the induction of an electric field between two objects having different electrical potentials. Electro Static Discharge (ESD) is a phenomenon where the generated electrostatic charges are exchanged.

If ESD is injected into a semiconductor chip manufactured by a micro electro mechanical system, circuit elements implemented inside the semiconductor chip may be damaged by the ESD. A variety of ESD protection circuits have recently been implemented in a semiconductor chip to prevent ESD.

The ESD protection circuits may supply a constant supply voltage to an OTP memory cell array when the supply voltage is received from an external voltage supply pad to program an OTP memory cell semiconductor.

However, when the ESD voltage is applied to the voltage supply pad, only the ESD voltage is applied when voltages capable of controlling the OTP memory cell array are not applied. Accordingly, the ESD voltage may be directly transmitted to the OTP memory cell array, and program operations may be generated in an undesired OTP memory cell. Accordingly, it may not be possible to use OTP chips if program operations are conducted in an unwanted OTP memory cell due to ESD voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power switch circuit includes a first level shifter configured to turn on a first switching element configured to receive a supply voltage from an external voltage supply pad in response to a program operation of a one-time programmable (OTP) memory cell array, a second level shifter configured to turn on a second switching element and provide the supply voltage to the OTP memory cell array in response to the program operation, a third level shifter configured to turn on a third switching element and provide an internally generated power voltage to the OTP memory cell array in response to a read operation of the OTP memory cell array, and an Electro-Static Discharge (ESD) protection circuit configured to turn off the first switching element in response to a flow of ESD voltage from the voltage supply pad.

An output node of the ESD protection circuit may be connected to an output node of the first level shifter.

The ESD protection circuit may include a transistor configured to increase a voltage of a pull-up node to an ESD voltage level in response to the flow of the ESD voltage from the voltage supply pad.

The first level shifter, the second level shifter, and the third level shifter may be configured to perform operations to open and close the first switching element, the second switching element, and the third switching element, respectively, based on at least one of a write-enable signal and a write-enable-bar signal, and the ESD protection circuit may be configured to control at least one of the write-enable-bar signal and the write-enable signal in response to the flow of the ESD voltage from the voltage supply pad.

The first level shifter may be configured to maintain a voltage of an output node at an ESD voltage level in response to the flow of the ESD voltage from the voltage supply pad.

An amount of current flowing into an output node of the first level shifter may be greater than an amount of current flowing into an output node of the ESD protection circuit.

A current of a transistor configured to generate a write-enable-bar signal and a write-enable signal of the power switch circuit may be greater than a current of a transistor configured to generate a write-enable-bar signal of the ESD protection circuit.

The ESD protection circuit may include a pull-up signal generator configured to generate a pull-up signal in response to the flow of the ESD voltage, a pull-up-bar signal generator configured to generate a pull-up-bar signal in response to the pull-up signal, and an output signal generator configured to generate an output signal in response to the pull-up-bar signal.

The output signal generator may include a first transistor and a second transistor, a gate node of the first transistor may be configured to receive the pull-up-bar signal, a source node of the first transistor may be connected to the supply voltage, and a drain node of the first transistor is connected to the second transistor, and a gate node of the second transistor may be configured to receive the pull-up-bar signal, a source node of the second transistor may be connected to the drain node of the first transistor, and a drain node of the second transistor may be configured to generate the output signal.

The ESD protection circuit may include a write-enable-bar signal controller that may be configured to control a write-enable-bar signal.

The write-enable-bar signal controller may include an inverter configured to convert the pull-up-bar signal, and a plurality of N-type Metal Oxide Semiconductors (NMOSs) configured to control the write-enable-bar signal based on the converted pull-up bar signal.

In a general aspect, a power switch circuit includes a first level shifter configured to perform operations to open and close a first switching element that is configured to receive a supply voltage provided from a voltage supply pad, a second level shifter configured to perform operations to open and close a second switching element connected to the first switching element and a one-time programmable (OTP) memory cell array, and configured to determine whether to provide the supply voltage to the OTP memory cell array, a third level shifter configured to perform operations to open and close a third switching element connected to the OTP memory cell array, and configured to determine whether to provide a power voltage to the OTP memory cell array, and an Electro-Static Discharge (ESD) protection circuit configured to turn off the first switching element in response to an ESD voltage provided from the voltage supply pad.

An output node of the ESD protection circuit may be connected to an output node of the first level shifter.

The ESD protection circuit may include a transistor configured to increase a voltage of a pull-up node to an ESD voltage level in response to the flow of the ESD voltage from the voltage supply pad.

The first level shifter, the second level shifter, and the third level shifter may be configured to open and close the first switching element, the second switching element, and the third switching element, respectively, based on a write-enable signal and a write-enable-bar signal, and the ESD protection circuit may be configured to control the write-enable-bar signal when the ESD voltage is flowed from the voltage supply pad.

The first level shifter may be configured to maintain a voltage of an output node to a level of the flowed ESD voltage in response to the flow of the ESD voltage from the voltage supply pad.

The ESD protection circuit may include a pull-up signal generator configured to generate a pull-up signal in response to the flow of the ESD voltage, a pull-up-bar signal generator configured to generate a pull-up-bar signal in response to the pull-up signal, and an output signal generator configured to generate an output signal in response to the pull-up-bar signal.

The output signal generator may include a first transistor and a second transistor, a gate node of the first transistor may be configured to receive the pull-up-bar signal, a source node of the first transistor may be connected to the supply voltage, and a drain node of the first transistor is connected to the second transistor, and a gate node of the second transistor is configured to receive the pull-up-bar signal, a source node of the second transistor is connected to the drain node of the first transistor, and a drain node of the second transistor is configured to generate the output signal.

The ESD protection circuit may include a write-enable-bar signal controller that may be configured to control a write-enable-bar signal.

The write-enable-bar signal controller may include an inverter configured to convert the pull-up-bar signal, and a plurality of N-type Metal Oxide Semiconductors (NMOSs) configured to control the write-enable-bar signal based on the converted pull-up bar signal.

A method includes receiving a programming voltage through a first switching element connected between an external voltage source and a voltage supply pad in response to a program operation, applying the programming voltage to a memory cell array through a second switching element, reading the programmed data by applying an internally generated power voltage to the memory cell array through a third switching element in response to a read operation, turning off the first switching element when an Electro-Static Discharge (ESD) voltage is flowed to the voltage supply pad.

The first switching element, second switching element, and the third switching element may be configured to open and close based on at least one of a write-enable signal and a write-enable-bar signal, and the memory device further comprises an ESD protection circuit configured to control at least one of the write-enable signal and the write-enable-bar signal in response to the flow of the ESD voltage.

An amount of a current of a transistor configured to generate a write-enable signal and a write-enable-bar signal may be greater than an amount of a current of a transistor configured to generate a write-enable-bar signal of the ESD protection circuit.

In a general aspect, a power switch circuit includes a first switching circuit configured to select a first voltage supply and provide the selected first voltage supply to a memory cell array in response to a program operation of the memory cell array, a second switching circuit configured to select a second voltage supply and provide the selected second voltage supply to the memory cell array in response to a read operation of the memory cell array, and an Electro static Discharge (ESD) protection circuit configured to detect an ESD voltage received from a source of the first voltage supply.

The first switching circuit may include a first level shifter configured to turn on a first switching element that receives the first voltage, and a second level shifter configured to turn on a second switching element that receives the first voltage.

The second switching circuit may include a third level shifter configured to turn on a third switching element that receives the second voltage supply.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

An example of the present disclosure may provide a power switch circuit which has an ESD protection operation that selects either a supply voltage received from a voltage supply pad (OTPV), or an internally generated power voltage (VDD) and provides the selected voltage to an OTP memory cell array. The OTPV is a programming voltage, for example, approximately 6~7V. The VDD is the internally generated power voltage, for example, approximately 1.2V, for driving a low voltage (LV) device.

An example of the present disclosure may prevent an ESD voltage from being transferred to a one-time programmable (OTP) memory cell array even when the ESD voltage is introduced from a voltage supply pad so that an OTP memory cell is not programmed by the ESD voltage.

An example of the present disclosure may add an ESD protection circuit to a power switch circuit so that ESD voltage is not transferred to an OTP memory cell array even when only the ESD voltage is applied and a control voltage of the OTP memory cell array is not applied.

Figure 1:
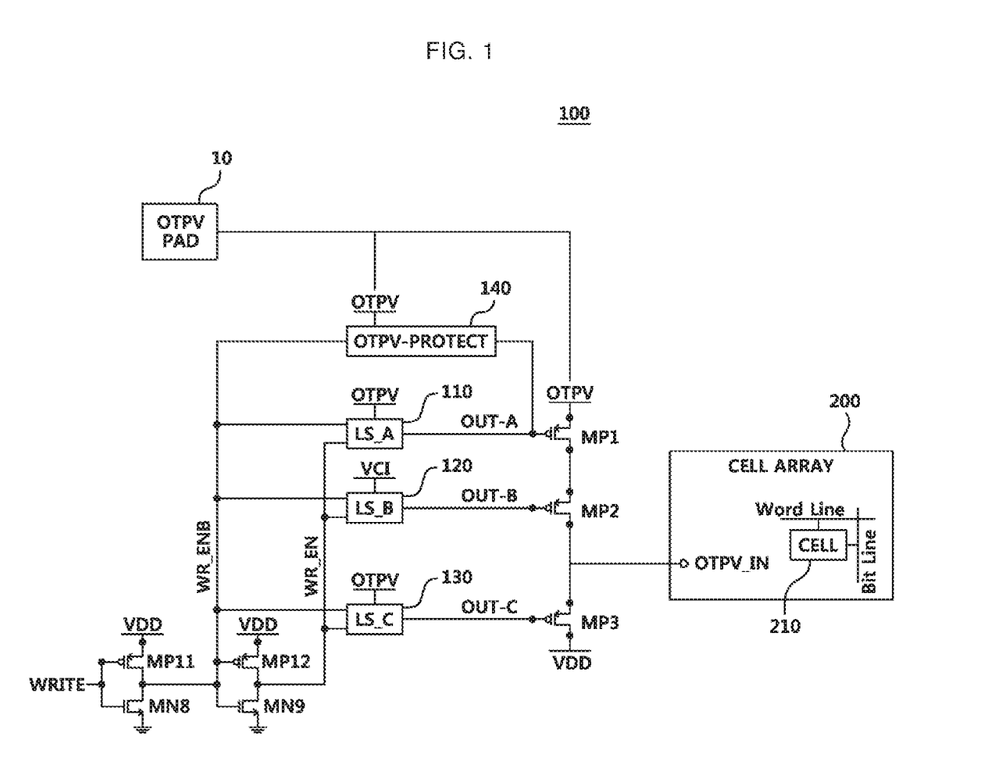
FIG. 1 is a block diagram of an example of a power switch circuit including an ESD protection circuit in accordance with one or more embodiments.

FIG. 1 is a block diagram illustrating an example of a power switch circuit including an ESD protection circuit according to an example.

Referring to FIG. 1, a power switch circuit 100, which includes an ESD protection circuit, may select either a supply voltage OTPV received from a voltage supply pad 10 (OTPV PAD) or an internally generated power voltage VDD, and provide the selected voltage to an OTP memory cell array 200.

According to an example, the power switch circuit 100 may include a first level shifter 110, a second level shifter 120, a third level shifter 130, an ESD protection circuit 140, a first switching element MP1, a second switching element MP2, and a third switching element MP3. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The power switch circuit 100 may receive supply voltage OTPV from the external voltage supply pad 10, and provide the supply voltage OTPV to the OTP memory cell array 200 to thereby supply a constant supply voltage OTPV to the OTP memory cell array 200 regardless of process variation. In addition, the power switch circuit 100 may receive the supply voltage OTPV from the external voltage supply pad 10 such that a charge pump circuit for directly generating the supply voltage OTPV may not be separately needed, and the form factor may be reduced.

According to an example, a power switch circuit 100 may provide a supply voltage OTPV to an OTP memory cell array 200 when the program operation of the OTP memory cell array 200 is performed, and the power voltage VDD may be supplied to the OTP memory cell array 200 when the read operation of the OTP memory cell array 200 is performed.

The power switch circuit 100 may select the supply voltage OTPV or the power voltage VDD via the first switching element MP1, the second switching element MP2, and the third switching element MP3 which are opened and closed based on a write-enable signal WR_EN and a write-enable-bar signal WR_ENB.

According to an example, a first level shifter 110 and a second level shifter 120 may provide the supply voltage to the OTP memory cell array 200 by turning on each of a first switching element MP1 and a second switching element MP2 based on a write-enable signal WR_EN and a write-enable-bar signal WR_ENB if program operation of the OTP memory cell array is performed.

According to an example, if a first level shifter 110 has a program command for the OTP memory cell array, the first level shifter 110 may turn on a first switching element MP1 which receives the supply voltage OTPV from an external voltage supply pad 10.

According to an example, if a second level shifter 120 has a program command for the OTP memory cell array, the second level shifter 120 may turn on the second switching element MP2 to provide the supply voltage to the OTP memory cell array 200.

Figure 3:
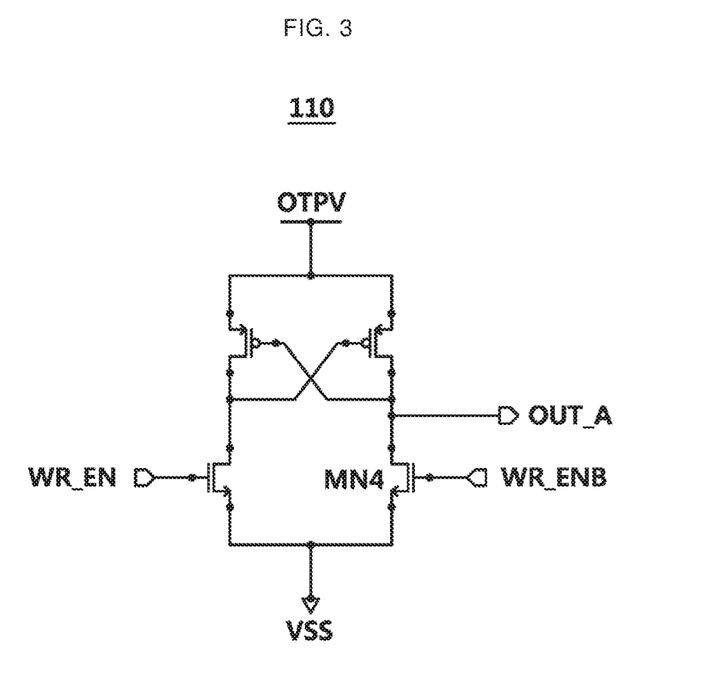
FIG. 3 is a circuit diagram illustrating an example of a first level shifter of a power switch circuit including an ESD protection circuit in accordance with one or more embodiments.

In detail, if a program command for the OTP memory cell array is received, the outputs of the first level shifter 110 and the second level shifter 120 become low, and the output of a third level shifter 130 becomes high, and thus, the first switching element MP1 and the second switching element MP2 are turned on and the third switching element MP3 is turned off so that the supply voltage OTPV is transferred to the OTP memory cell array. Referring to FIG. 1 and FIG. 3, based on the program command, the write-enable signal WR_EN becomes low, the write-enable signal-bar WR_ENB becomes high and therefore an NMOS MN4 of FIG. 3 is turned on and the output node OUT-A outputs low.

According to an example, if a read operation for the OTP memory cell array is performed, a third level shifter 130 turns on a third switching element MP3 based on a write-enable signal WR_EN and a write-enable-bar signal WR_ENB to provide the power voltage VDD to the OTP memory cell array 200.

In detail, if a read command for the OTP memory cell array is received, the first switching element MP1 and the second switching element MP2 are turned off and the third switching element MP3 is turned on by the outputs of the first level shifter 110, the second level shifter 120, and the third level shifter 130 to provide the power voltage VDD to the OTP memory cell array 200.

According to an example, if the third level shifter 130 has a read instruction for the OTP memory cell array, it turns on a third switching element MP3 to provide an internally generated power voltage VDD to the OTP memory cell array 200.

According to an example, a power switch circuit 100 may include an ESD protection circuit 140 that prevents an ESD voltage flowing into the voltage supply pad from being transferred to the OTP memory cell array.

According to an example, the power switch circuit 100 can protect the OTP memory cell array 200 by turning off the first switching element MP1 when an ESD voltage is received from the voltage supply pad 10.

The voltage of the ESD protection circuit 140 may be connected to the OTPV voltage supply pad 10. Therefore, the ESD protection circuit 140 may be operated immediately when the supply voltage is generated in the voltage supply pad 10. At this time, the ESD protection circuit 140 may be operated only by the supply voltage OTPV. When the ESD voltage flows into the voltage supply pad 10, the ESD protection circuit 140 is immediately operated by the flowed ESD voltage. That is, the ESD protection circuit 140 may operate even when the power voltage VDD needed for controlling the OTP memory cell array is not applied.

According to an example, an output node of the ESD protection circuit 140 may be connected to an output node OUT-A of the first level shifter. Therefore, the ESD protection circuit 140 may turn off a first switching element MP1 whose gate is connected to the output node OUT-A of the first level shifter 110.

In order to prevent the first switching element MP1 from turning off, during the program operation of the OTP memory cell array, the program operation may be normally performed without the influence of the ESD protection circuit 140.

An output node OUT-A of the ESD protection circuit 140 and the output node OUT-A of the first level shifter 110 may be the same node. The output node OUT-A should to be kept low (that is, 0V) in order to turn on the first switching element MP1 during the program operation of the OTP memory cell array 200. Therefore, the circuit may be configured such that an amount of current flowing into the output node of the first level shifter 110 is greater than an amount of current flowing into the output node of the ESD protection circuit 140. For example, an element size of the ESD protection circuit 140 may be set so that an amount of current flowing into the output node of the first level shifter 110 may be three times or greater than an amount of current flowing into the output node of the ESD protection circuit 140. Preferably, the amount of current flowing into the output node of the first level shifter 110 may be set ten times or greater than the amount of current flowing into the output node of the ESD protection circuit 140.

Additionally, a power switch circuit 100 may be configured so that an amount of current of transistors MP11, MN8, MP12, MN9 which generate a write-enable signal and a write-enable-bar signal of the power switch circuit is greater than an amount of current of transistors MN6, MN7 (in FIG. 2) which generate a write-enable-bar signal of the ESD protection circuit 140. For example, an element size of the ESD protection circuit 140 may be configured so that an amount of current of transistors which generate a write-enable signal and a write-enable-bar signal of the power switch circuit may be three times or greater than an amount of current of transistors which generate a write-enable-bar signal of the ESD protection circuit 140. Preferably, a circuit may be set so that an amount of current of transistors which generate a write-enable signal and a write-enable-bar signal of the power switch circuit may be ten times or greater than an amount of current of transistors which generate a write-enable-bar signal of the ESD protection circuit 140.

The detailed operation principle of the ESD protection circuit 140 will be described with reference to FIG. 2.

Figure 2:
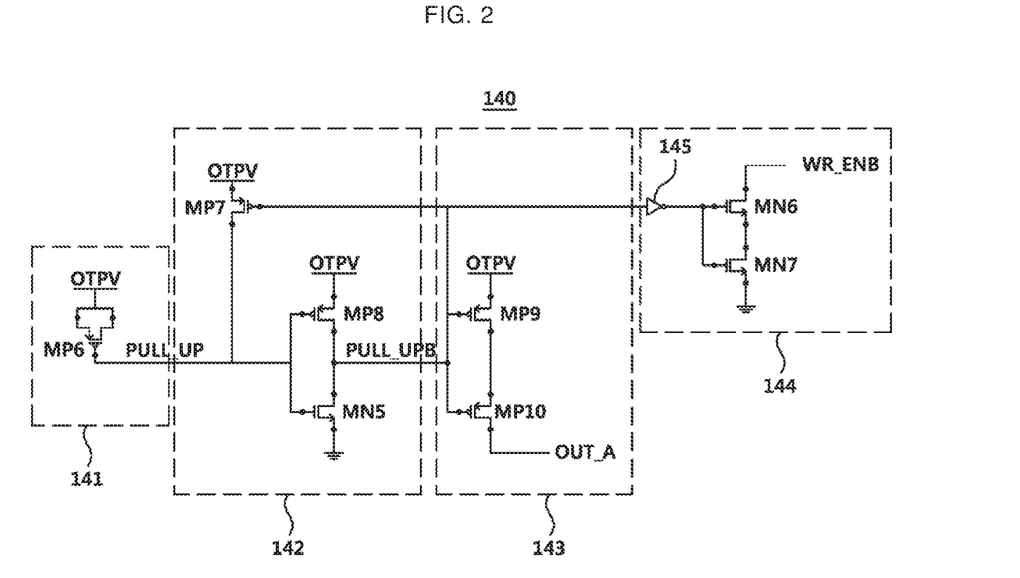
FIG. 2 is a circuit diagram illustrating an example of an ESD protection circuit in accordance with one or more embodiments.

FIG. 2 is a circuit diagram illustrating an example of an ESD protection circuit.

When an ESD voltage is applied to a voltage supply pad 10 (FIG. 1), an output voltage of the ESD protection circuit may become equal to the applied ESD voltage, and thus the first switching element MP1 is turned off so that the ESD voltage applied to the voltage supply pad is not transferred to the OTP memory cell array.

Referring to FIG. 2, an ESD protection circuit 140 may include a pull-up signal generator 141 which generates a pull-up signal PULL_UP based on supply voltage OTPV, a pull-up-bar signal generator 142 which generates a pull-up-bar signal PULL_UPB in response to the pull-up signal, and an output signal generator 143 which generates an output signal OUT_A in response to the pull-up-bar signal.

According to an example, if an ESD voltage is applied to a voltage supply pad, the pull-up signal generator 141 of the ESD protection circuit 140 increases a voltage of the pull-up node to the applied ESD voltage level through a PMOS transistor MP6 operating as a capacitor.

According to an example, an ESD protection circuit 140 includes a PMOS transistor MP6 having a source and a drain connected to the supply voltage to increase the voltage of the pull-up node to the applied ESD voltage in response to the flow of an ESD voltage from the voltage supply pad.

According to an example, if an ESD voltage flows into the voltage supply pad, the pull-up-bar signal generator 142 enables a pull-up-bar node to be 0V.

According to an example, the output signal generator 143 generates an output signal OUT_A having the same voltage as the applied ESD voltage OTPV.

According to an example, the output signal generator 143 includes a first transistor MP9 and a second transistor MP10. In this example, the first transistor MP9 and the second transistor MP10 may be made of PMOSs. A gate node of the first transistor MP9 may receive a pull-up-bar signal; a source node of the first transistor MP9 may be connected to supply voltage OTPV; and a drain node of the first transistor MP9 may be connected to a source node of the second transistor MP10. A gate node of the second transistor MP10 may receive a pull-up-bar signal from the pull-up-bar signal generator 142; the source node of the second transistor MP10 may be connected to the drain node of the first transistor MP9; and a drain node of the second transistor MP10 may generate an output signal OUT_A.

An ESD protection circuit may transfer an ESD voltage level flowing into the voltage supply pad to the output node, and a gate input of the first switching element MP1 may become equal to the ESD voltage level such that the first switching element MP1 can be turned off. Therefore, the ESD voltage received from the voltage supply pad may not be transferred to the OTP memory cell array. That is, even if an ESD voltage flows into a voltage supply pad, because the ESD voltage is not transferred to an OTP memory cell array due to the ESD protection circuit, program operation by ESD may not occur in an OTP memory cell.

According to an example, the ESD protection circuit 140 may include a write-enable-bar signal generator 144 which controls the write-enable-bar signal when an ESD voltage is received from a voltage supply pad. For example, a first level shifter may have to have a high value as an output value in order for the first switching element MP1 to be turned off. At this time, since power voltage VDD is not provided to the first level shifter, voltage values of a write-enable signal and a write-enable-bar signal may be in a state where the voltage value is unknown. Therefore, if a write-enable-bar signal controller makes the write-enable-bar signal 0, the first level shifter can maintain the high value as the output value.

According to an example, the write-enable-bar signal generator 144 includes an inverter 145 for converting a pull-up-bar signal and a plurality of N-type Metal Oxide Semiconductors (NMOSs) MN6, MN7 for controlling a write-enable-bar signal using the converted signal.

According to an example, an NMOS MN6 receives a signal converted from a pull-up-bar signal at an inverter 145 by an input to a gate of the NMOS MN6, and a drain node of the NMOS MN6 outputs a write-enable-bar signal, and a source node of the NMOS MN6 is connected to a drain node of an NMOS MN7. The NMOS MN7 receives a signal converted from a pull-up-bar signal at the inverter 145 by an input to a gate of the NMOS MN7 and a drain node of NMOS MN7 is connected to a source node of the NMOS MN6, and a source node of the NMOS MN7 is connected to the ground.

During program operation of the OTP memory cell array, the program operation can be normally performed without the influence of the ESD protection circuit 140. For this, an element size may be set so that an amount of current of transistors MN8, MP11, MN9, MP12 (of FIG. 1) which generate a write-enable-bar signal and a write-enable signal of the power switch circuit is greater than an amount of current of transistors MN6, MN7 which generate a write-enable-bar signal of the ESD protection circuit. For example, an element size of the ESD protection circuit 140 may be set so that an amount of current of transistors MN8, MP11, MN9, MP12 (of FIG. 1) which generate a write-enable-bar signal and a write-enable signal of the power switch circuit may be three times or greater than an amount of current of transistors MN6, MN7 which generate a write-enable-bar signal of the ESD protection circuit. Preferably, the circuit may be set so that an amount of current of transistors MN8, MP11, MN9, MP12 (of FIG. 1) which generate a write-enable-bar signal and a write-enable signal of the power switch circuit may be ten times or greater than an amount of current of transistors MN6, MN7 generating a write-enable-bar signal of the ESD protection circuit.

FIG. 3 is a circuit diagram illustrating an example of a first level shifter of a power switch circuit including an ESD protection circuit.

Referring to FIG. 3, a first level shifter 110 may open and close a first switching element based on a write-enable-signal WR_EN and a write-enable-bar signal WR_ENB. In an example, the first level shifter 110 may be implemented through a current mirror. That is, the first level shifter 110 may form a symmetrical structure with two P-type Metal Oxide Semiconductors (PMOSs) and two NMOSs, and one end of the current mirror may correspond to the output node OUT_A of the first level shifter 110. At this time, the output OUT_A of the first level shifter 110 may be applied to a gate of the first switching element MP1.

According to an example, the first level shifter 110 may maintain the voltage of the output node OUT_A to the flowed ESD voltage in response to the flow of the ESD voltage from the voltage supply pad. For this, an NMOS MN4 connected to the output node OUT_A may be turned off.

A write-enable signal WR_EN and a write-enable-bar signal WR_ENB, which are the inputs of the first level shifter 110, may be controlled by a power voltage VDD. However, since the power voltage VDD is not applied in a state where an ESD voltage is applied, the write-enable WR_EN and the write-enable-bar signal WR_ENB become floating states in which the voltage level is unknown. In this example, although an ESD voltage level to which the voltage of an output node flows is enabled by the ESD protection circuit, if the write-enable-bar signal is in a floating state, the voltage of an output node OUT_A may be discharged through the NMOS MN4 connected to the write-enable-bar signal WR_ENB. Accordingly, the ESD voltage level to which the voltage of the output node OUT_A cannot be maintained.

In order to prevent this, if it becomes an ESD voltage level where a pull-up signal flows in an ESD protection circuit, a write-enable-bar signal may be set to 0 so that the first level shifter maintains a high value as an output value. That is, since the write-enable-bar signal WR_ENB of the first level shifter 110 is 0 v, an NMOS MN4 connected to the write-enable-bar signal WR_ENB is turned off and an ESD voltage level to which the voltage of an output node OUT_A is flowed can be maintained.

According to an example, an element size may be determined so that an amount of current flowing into the output node OUT_A of the first level shifter is greater than an amount of current flowing into the output node OUT_A of the ESD protection circuit. For example, the circuit may be set so that an amount of current flowing into the output node OUT_A of the first level shifter may be three times or greater than an amount of current flowing into the output node OUT_A of the ESD protection circuit. Preferably, the circuit may be set so that an amount of current flowing into the output node OUT_A of the first level shifter is ten times or greater than an amount of current flowing into the output node OUT_A of the ESD protection circuit.

In the normal program operation of the OTP memory cell array, a voltage of the output node OUT_A of the first level shifter 110 and a voltage of the output node OUT_B of the second level shifter 120 become low level (that is, 0V) such that a supply voltage OTPV should be transferred to the OTP memory cell array by turning on a first switching element MP1 and a second switching element MP2. An output node OUT_A of the ESD protection circuit and an output node OUT_A of the first level shifter 110 may be the same nodes connected to each other. Therefore, in order to maintain the voltage of the output node OUT_A as low (that is, 0V) during the program operation, it may be set so that the sizes of PMOSs MP9, MP10 (of FIG. 2) of the ESD protection circuit 140 are very small and the size of NMOS MN4 of the first level shifter 110 are very large, which allows the circuit to be configured so that an amount of current of the NMOS MN4 is larger than an amount of current of the PMOS MP9, MP10 (of FIG. 2).

For example, an element size may be set so that an amount of current of an NMOS MN4 is three times or greater than an amount of current of the PMOSs MP9, MP10 (of FIG. 2). Preferably, an element size may be configured so that an amount of an NMOS MN4 is ten times or greater than an amount of current of the PMOSs MP9, MP10 (of FIG. 2).

Figure 4:
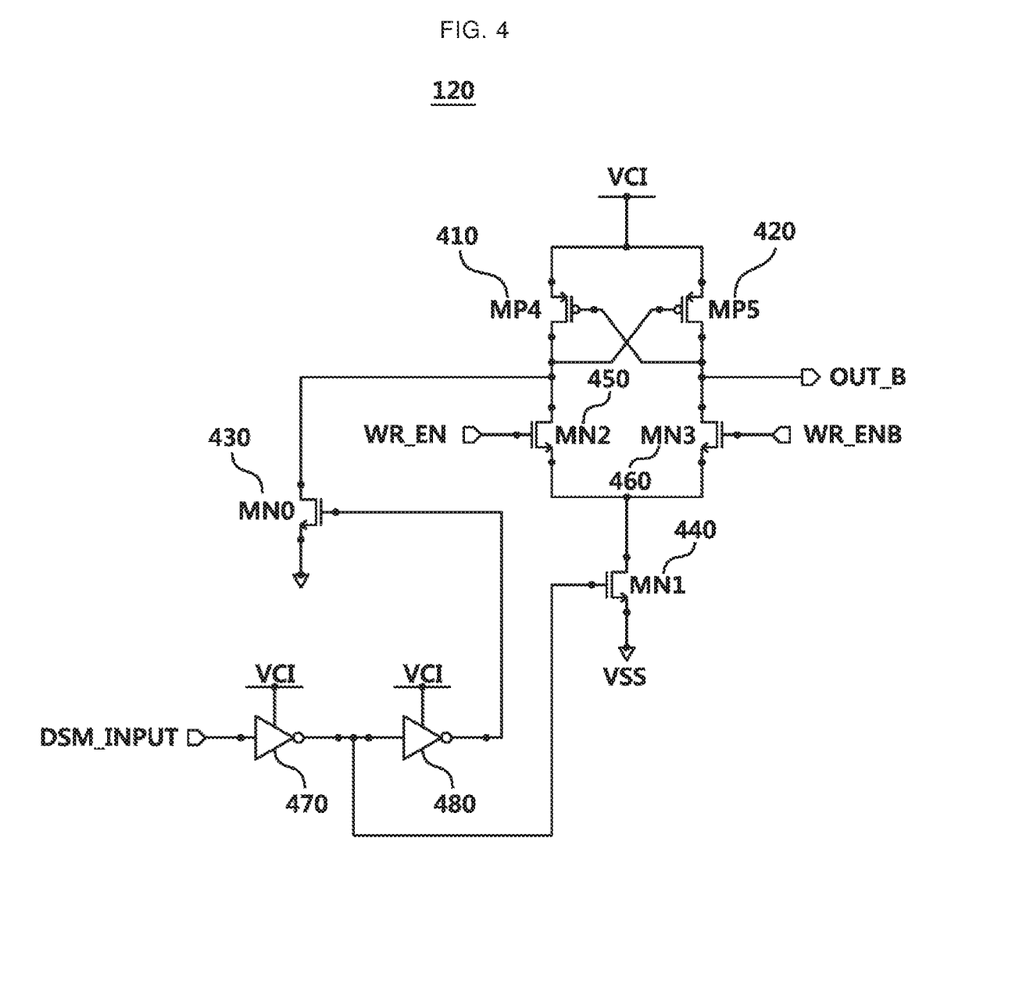
FIG. 4 is a circuit diagram illustrating an example of a second level shifter of a power switch circuit including an ESD protection circuit in accordance with one or more embodiments.

FIG. 4 is a circuit diagram illustrating an example of a second level shifter of a power switch circuit including an ESD protection circuit.

Referring to FIG. 4, a second level shifter 120 may include a fourth switching element 410, a fifth switching element 420, a first NMOS 430, a second NMOS 440, a third NMOS 450, a fourth NMOS 460, a third inverter 470, and a fourth inverter 480.

In an example, the second level shifter 120 may be implemented by a current mirror. In detail, the fourth switching element 410 and third NMOS 450, and the fifth switching element 420 and fourth NMOS 460 may have a symmetrical structure with each other. The third NMOS 450 may receive a write-enable signal WR_EN, and the fourth NMOS 460 may receive a write-enable-bar signal WR_ENB. The output terminal OUT_B of the second level shifter 120 may correspond to the common terminal of a drain of the fifth switching element 420 and a drain of the fourth NMOS 460.

The respective third and fourth inverters 470, 480 may be connected in series, and the output of the third inverter 470 may be applied to the flow of the fourth inverter 480. That is, the outputs of the respective third and fourth inverters 470, 480 may be implemented differently each time. In an example, the second level shifter 120 may receive a deep sleep mode input signal DSM_INPUT, and output a high level (or 1) or a low level (or 0) through the third and fourth inverters 470, 480. Here, the output of the third inverter 470 may be applied to a gate of the second NMOS 440, and the output of the fourth inverter 480 may be applied to a gate of the first NMOS 430.

According to an example, the second level shifter 120 may prevent a supply voltage OTPV provided to an OTP memory cell array 220 in a deep-sleep mode that operates at a low power level. In detail, the second level shifter 120 may receive a deep sleep mode input signal DSM_INPUT to output a rated voltage VCI in a deep sleep mode. The VCI is an externally supplied voltage for example, approximately 3.3V for driving a medium voltage device, The second level shifter 120 may block a supply voltage OTPV provided to the OTP memory cell array 200 based on the deep sleep mode input signal DSM_INPUT to maintain the floating state of the voltage supply pad 10, or connect the voltage supply pad 10 to a ground voltage VSS or the rated voltage VCI.

For example, when the power switch circuit 100 operates in a deep sleep mode, the second level shifter 120 may receive a deep sleep mode input signal DSM_INPUT of a high level (or 1). If the second level shifter 120 receives the deep sleep mode input signal DSM_INPUT of a high level (or 1), a gate of the first NMOS 430 may receive a high level (or 1), and a gate of the second NMOS 440 may receive a low level (or 0). That is, the fifth switching element 420 and the first NMOS 430 are turned on and the second NMOS 440 is turned off so that the output OUT_B of the second level shifter 120 can keep the rated voltage VCI. Therefore, the second level shifter 120 may output the rated voltage VCI to turn off the second switching element MP2, and may cut off a supply voltage OTPV provided to the OTP memory cell array 200 in a deep sleep mode operating at a low power level.

Figure 5:
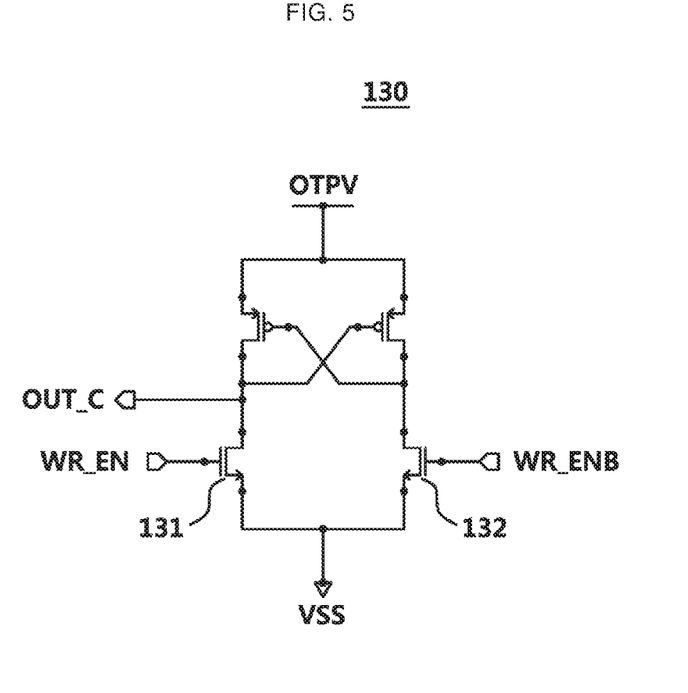
FIG. 5 is a circuit diagram illustrating an example of a third level shifter of a power switch circuit including an ESD protection circuit in accordance with one or more embodiments.

FIG. 5 is a circuit diagram illustrating an example of a third level shifter of a power switch circuit including an ESD protection circuit.

Referring to FIG. 5, a third level shifter 130 may open and close the third switching element MP3 based on a write-enable signal WR_EN and a write-enable-bar signal. In an example, the third level shifter 130 may be implemented through a current mirror. Here, the third level shifter 130 may form a symmetrical structure of two PMOSs and two NMOSs, similar to the first level shifter 110, whereas the position of an output terminal of the third level shifter may differ from the position of an output terminal of the first level shifter 110. For example, an output terminal OUT_A of the first level shifter 110 may be connected to a drain of an NMOS 132 receiving a write-enable-bar signal WR_ENB and an output terminal OUT_C of the third level shifter 130 may be connected to a drain of an NMOS 131 receiving a write-enable signal WR_EN. That is, each of the first and third level shifters 110, 130 may output different voltage levels even when receiving the same write-enable-bar WR_ENB signal. When program operation of the OTP memory cell array 200 is performed, although each of the first and third level shifters 110, 130 receives a write-enable signal WR_EN and a write-enable-bar signal WR_ENB, the first level shifter 110 may be turned on and the third level shifter 130 may be turned off. Also, when read operation of the OTP memory cell array 200 is performed, although each of the first and third level shifters 110, 130 may receive the same write-enable signal WR_EN and the write-enable-bar signal WR_ENB, the first level shifter 110 may be turned off and the third level shifter 130 may be turned on. The output OUT_C of the third level shifter 130 may be applied to a gate of the third switching element MP3.

Therefore, the power switch circuit 100 may select either a supply voltage OTPV received from an external voltage supply pad 10, or a power voltage VDD internally generated to provide the voltage to the OTP memory cell array 200. When the program operation or the read operation of the OTP memory cell array 200 is performed, the power switch circuit 100 opens and closes the first, second, and third switching elements MP1, MP2, MP3 to select either one of the supply voltage OTPV and the power voltage VDD and provide one to the OTP memory cell array 200. The power switch circuit 100 may block a leakage path of the supply voltage OTPV by turning off the second switching element MP2 in a deep sleep mode of the OTP memory cell array 200, and may include a second level shifter 120 that outputs a rated voltage VCI in a deep sleep mode of the OTP memory cell array 200. Additionally, the power switch circuit 100 may block the supply voltage provided from the deep sleep mode of the OTP memory cell array 200 to the OTP memory cell array 200 to maintain the floating state of the voltage supply pad 10 or connect the voltage supply pad 10 to a ground voltage VSS or a rated voltage VCI.

Figure 6:
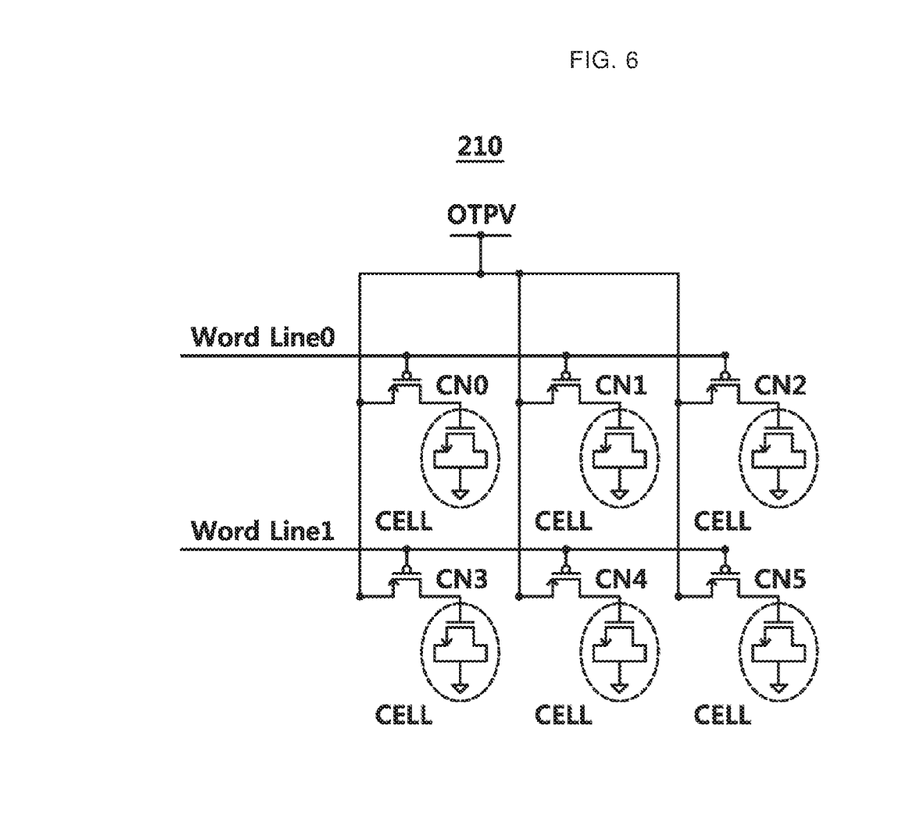
FIG. 6 is a circuit diagram illustrating an example of an OTP memory cell connected to a power switch circuit including an ESD protection circuit in accordance with one or more embodiments.

FIG. 6 is a circuit diagram illustrating an example of an OTP memory cell connected to a power switch circuit including an ESD protection circuit.

Referring to FIG. 6, a word line array 210 of an OTP memory cell array includes a first word line Word Line0 and a second word line Word Line1. At this time, an ESD voltage may be applied to a voltage supply pad, the ESD voltage is transferred to CN nodes CN0, CN1, CN2, CN3, CN4, CN5, so that non-normal program operation may be performed. Therefore, flow of the ESD voltage to the OTP memory cell array may be prevented through an ESD protection circuit.

The apparatus and methods described above may be implemented as, and by, hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods of FIGS. 1-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EE-PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD- Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

A power switch circuit according to one or more examples may prevent ESD voltage from being transferred to an OTP memory cell array even if an ESD voltage flows from a voltage supply pad, thereby preventing an OTP memory cell from being programmed by ESD.

An addition of an ESD protection circuit to a power switch circuit according to an example may prevent an ESD voltage from being transferred to an OTP memory cell array even when only ESD voltage is applied, and a control voltage of OPT memory cell array is not applied.

A power switch circuit according to one or more examples may allow program operation to perform without being disturbed by an ESD protection circuit in normal program operation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power switch circuit comprising:
    a first level shifter configured to turn on a first switching element configured to receive a supply voltage from an external voltage supply pad in response to a program operation of a one-time programmable (OTP) memory cell array;
    a second level shifter configured to turn on a second switching element and provide the supply voltage to the OTP memory cell array in response to the program operation;
    a third level shifter configured to turn on a third switching element and provide an internally generated power voltage to the OTP memory cell array in response to a read operation of the OTP memory cell array; and
    an Electro-Static Discharge (ESD) protection circuit configured to turn off the first switching element in response to a flow of ESD voltage from the external voltage supply pad.

2. The power switch circuit of claim 1, wherein an output node of the ESD protection circuit is connected to an output node of the first level shifter.

3. The power switch circuit of claim 1, wherein the ESD protection circuit comprises a transistor configured to increase a voltage of a pull-up node to an ESD voltage level in response to the flow of the ESD voltage from the external voltage supply pad.

4. The power switch circuit of claim 1, wherein the first level shifter, the second level shifter, and the third level shifter are configured to perform operations to open and close the first switching element, the second switching element, and the third switching element, respectively, based on at least one of a write-enable signal and a write-enable-bar signal, and
    the ESD protection circuit is configured to control at least one of the write-enable-bar signal and the write-enable signal in response to the flow of the ESD voltage from the external voltage supply pad.

5. The power switch circuit of claim 1, wherein the first level shifter is configured to maintain a voltage of an output node at an ESD voltage level in response to the flow of the ESD voltage from the external voltage supply pad.

6. The power switch circuit of claim 1, wherein an amount of current flowing into an output node of the first level shifter is greater than an amount of current flowing into an output node of the ESD protection circuit.

7. The power switch circuit of claim 1, wherein a current of transistors configured to generate a write-enable-bar signal and a write-enable signal of the power switch circuit is greater than a current of transistors configured to generate a write-enable-bar signal of the ESD protection circuit.

8. The power switch circuit of claim 1, wherein the ESD protection circuit comprises:
    a pull-up signal generator configured to generate a pull-up signal in response to the flow of the ESD voltage;
    a pull-up-bar signal generator configured to generate a pull-up-bar signal in response to the pull-up signal; and
    an output signal generator configured to generate an output signal in response to the pull-up-bar signal.

9. The power switch circuit of claim 8, wherein the output signal generator comprises a first transistor and a second transistor,
    a gate node of the first transistor is configured to receive the pull-up-bar signal, a source node of the first transistor is connected to the supply voltage, and a drain node of the first transistor is connected to the second transistor, and
    a gate node of the second transistor is configured to receive the pull-up-bar signal, a source node of the second transistor is connected to the drain node of the first transistor, and a drain node of the second transistor is configured to generate the output signal.

10. The power switch circuit of claim 8, wherein the ESD protection circuit comprises a write-enable-bar signal controller that is configured to control a write-enable-bar signal.

11. The power switch circuit of claim 10, wherein the write-enable-bar signal controller comprises:
    an inverter configured to convert the pull-up-bar signal; and a plurality of N-type Metal Oxide Semiconductor (NMOS) transistors configured to control the write-enable-bar signal based on the converted pull-up bar signal.

12. A power switch circuit comprising:
a first level shifter configured to perform operations to open and close a first switching element that is configured to receive a supply voltage provided from a voltage supply pad;
a second level shifter configured to perform operations to open and close a second switching element connected to the first switching element and a one-time programmable (OTP) memory cell array, and configured to determine whether to provide the supply voltage to the OTP memory cell array;
a third level shifter configured to perform operations to open and close a third switching element connected to the OTP memory cell array, and configured to determine whether to provide a power voltage to the OTP memory cell array; and
an Electro-Static Discharge (ESD) protection circuit configured to turn off the first switching element in response to an ESD voltage provided from the voltage supply pad.

13. The power switch circuit of claim 12, wherein an output node of the ESD protection circuit is connected to an output node of the first level shifter.

14. The power switch circuit of claim 12, wherein the ESD protection circuit comprises a transistor configured to increase a voltage of a pull-up node to an ESD voltage level in response to the flow of the ESD voltage from the voltage supply pad.

15. The power switch circuit of claim 12, wherein the first level shifter, the second level shifter, and the third level shifter are configured to open and close the first switching element, the second switching element, and the third switching element, respectively, based on a write-enable signal and a write-enable-bar signal, and
wherein the ESD protection circuit is configured to control the write-enable-bar signal when the ESD voltage is flowed from the voltage supply pad.

16. The power switch circuit of claim 12, wherein the first level shifter is configured to maintain a voltage of an output node to a level of the flowed ESD voltage in response to the flow of the ESD voltage from the voltage supply pad.

17. The power switch circuit of claim 12, wherein the ESD protection circuit comprises:
a pull-up signal generator configured to generate a pull-up signal in response to the flow of the ESD voltage;
a pull-up-bar signal generator configured to generate a pull-up-bar signal in response to the pull-up signal; and
an output signal generator configured to generate an output signal in response to the pull-up-bar signal.

18. The power switch circuit of claim 17, wherein the output signal generator comprises a first transistor and a second transistor,
a gate node of the first transistor is configured to receive the pull-up-bar signal, a source node of the first transistor is connected to the supply voltage, and a drain node of the first transistor is connected to the second transistor, and
a gate node of the second transistor is configured to receive the pull-up-bar signal, a source node of the second transistor is connected to the drain node of the first transistor, and a drain node of the second transistor is configured to generate the output signal.

19. The power switch circuit of claim 17, wherein the ESD protection circuit comprises a write-enable-bar signal controller that is configured to control a write-enable-bar signal.

20. The power switch circuit of claim 19, wherein the write-enable-bar signal controller comprises an inverter configured to convert the pull-up-bar signal, and a plurality of N-type Metal Oxide Semiconductor (NMOS) transistors configured to control the write-enable-bar signal based on the converted pull-up bar signal.

21. A method comprising:
receiving a programming voltage through a first switching element connected between an external voltage source and a voltage supply pad in response to a program operation;
applying the programming voltage to a memory cell array through a second switching element;
reading the programmed data by applying an internally generated power voltage to the memory cell array through a third switching element in response to a read operation;
turning off the first switching element when an Electro-Static Discharge (ESD) voltage is flowed to the voltage supply pad,
wherein the first switching element, second switching element, and the third switching element are configured to open and close based on at least one of a write-enable signal and a write-enable-bar signal; and
controlling at least one of the write-enable signal and the write-enable-bar signal in response to the flow of the ESD voltage using an ESD protection circuit.

22. The method of claim 21, wherein an amount of a current of transistors configured to generate a write-enable signal and a write-enable-bar signal is greater than an amount of a current of transistors configured to generate a write-enable-bar signal of the ESD protection circuit.

23. A power switch circuit comprising:
a first switching circuit configured to select a first voltage supply and provide the selected first voltage supply to a memory cell array in response to a program operation of the memory cell array, comprising:
a first level shifter configured to turn on a first switching element that receives the first voltage supply, and
a second level shifter configured to turn on a second switching element that receives the first voltage, based on at least one of a write-enable signal and a write-enable-bar signal;
a second switching circuit configured to select a second voltage supply and provide the selected second voltage supply to the memory cell array in response to a read operation of the memory cell array, and
an Electro static Discharge (ESD) protection circuit configured to detect an ESD voltage received from a source of the first voltage supply and control at least one of the write-enable-bar signal and the write-enable signal in response to the detected ESD voltage.

24. The power switch of claim 23, wherein the second switching circuit comprises a third level shifter configured to turn on a third switching element that receives the second voltage supply.

* * * * *